(12) United States Patent
Naritomi

(10) Patent No.: US 7,576,991 B2
(45) Date of Patent: Aug. 18, 2009

(54) ELECTRICAL EQUIPMENT FOR JUNCTION AND METHOD OF MANUFACTURING THE SAME

(75) Inventor: Masanori Naritomi, Tokyo (JP)

(73) Assignee: Taisei Plas Co., Ltd., Tokyo (JP)

( * ) Notice: Subject to any disclaimer, the term of this patent is extended or adjusted under 35 U.S.C. 154(b) by 301 days.

(21) Appl. No.: 11/547,965

(22) PCT Filed: Jan. 12, 2005

(86) PCT No.: PCT/JP2005/000244

§ 371 (c)(1),
(2), (4) Date: Oct. 10, 2006

(87) PCT Pub. No.: WO2005/069462

PCT Pub. Date: Jul. 28, 2005

(65) Prior Publication Data
US 2007/0218721 A1    Sep. 20, 2007

(30) Foreign Application Priority Data
Jan. 13, 2004 (JP) ............................. 2004-004908
Apr. 12, 2004 (JP) ............................. 2004-116929

(51) Int. Cl.
*H05K 1/00* (2006.01)
(52) U.S. Cl. ........................... 361/748; 174/388
(58) Field of Classification Search ................. 361/737, 361/739, 704, 748; 439/131; 174/388
See application file for complete search history.

(56) References Cited

U.S. PATENT DOCUMENTS 4,082,915 A * 4/1978 Silver ........................... 174/51
5,739,463 A * 4/1998 Diaz et al. .................... 174/378
6,317,324 B1 * 11/2001 Chen et al. ................... 361/704
2004/0131917 A1 * 7/2004 Mazza et al. ................... 429/38
2004/0159455 A1 * 8/2004 Onizuka et al. ............... 174/50
2005/0000726 A1 * 1/2005 Kimata et al. ............... 174/256

FOREIGN PATENT DOCUMENTS

| JP | 9-512134 A | 12/1997 |
| JP | 2003-32840 A | 1/2003 |
| JP | 2003-200453 A | 7/2003 |

OTHER PUBLICATIONS

International Search Report of PCT/JP2005/000244 date of mailing Apr. 19, 2005.

* cited by examiner

Primary Examiner—Dean A. Reichard
Assistant Examiner—Yuriy Semenenko
(74) Attorney, Agent, or Firm—Westerman, Hattori, Daniels & Adrian, LLP.

(57) ABSTRACT

The present invention provides electrical equipment for junction improved in sealing performance and reduced in size and weight, and also provides a method of manufacturing the same. A face cover 6 and a back cover 7 are press-formed from an aluminum alloy. An electrical component 2 including a board 3, electronic parts 4 and terminals 5 is tightly held between the face cover 6 and the back cover 7. The peripheral edge A of the face cover 6 and the back cover 7 is hermetically sealed with a resin mold 10 formed by injection molding. The resin mold 10 has connector portions 10b in which the terminals 5 project out nakedly to allow connection with external electrical equipment.

15 Claims, 5 Drawing Sheets

PRIOR ART

ELECTRICAL EQUIPMENT FOR JUNCTION AND METHOD OF MANUFACTURING THE SAME

TECHNICAL FIELD

The present invention relates to electrical equipment for junction that is installed in an engine room of an automobile or the like, and also relates to a method of manufacturing such electrical equipment for junction. More particularly, the present invention relates to electrical equipment for junction in which a board having electronic parts mounted thereon is integrally sealed and covered with covers, and also relates to a method of manufacturing such electrical equipment for junction.

BACKGROUND ART

A conventional so-called junction box is constructed as shown, for example, in the fragmentary sectional view of FIG. 15. Various electronic elements as electronic parts 21 are mounted on a board 26, and terminals 22 are projected out from the peripheral edge of the board 26. The board 26, including the electronic parts 21, is electrically insulated with insulators 23 and 24 and thereafter housed in a box made of a synthetic resin. The junction box comprises a casing 25. Each terminal 22 projects out in a part of the peripheral edge of the casing 25. After the board 26 and so forth have been attached to the bottom of the casing 25, a lower cover 27 is attached to the casing 25 with the insulator 24 interposed between the lower cover 27 and the board 26. The lower cover 27 is provided with heat-radiating members 27a, e.g. fins.

The top of the casing 25 corresponds to the side of the board 26 on which the electronic parts 21 are mounted. The top of the casing 25 constitutes an opening. An upper cover 28 is installed in the opening on the top of the casing 25. The casing 25, the upper cover 28 and the lower cover 27 are usually molded pieces produced by injecting a synthetic resin. The board 26 is electrically insulated when installed in the casing 25. The joint of each cover and the casing 25 is waterproofed to prevent entry of water, etc. Conventionally, sealing has been provided for the prevention of entry of water, etc.

The following methods are publicly known as examples of waterproofing techniques for connection boxes such as the above-described prior art junction box. In one method, the joint surfaces of the casing and the cover are provided with ribs, and the casing and the cover are interlocked with each other to effect waterproofing. In another method, a part of the electrical connection box is provided with a partition wall for leading in electric wires, thereby preventing entry of water into the electrical component housing box.

As has been stated above, the conventional junction boxes are in the form of boxes housing electrical components. Most of them are casings molded of a synthetic resin or the like. In a typical type of conventional junction box, electronic parts are housed in such a casing, and terminals are projected out of the casing. Alternatively, electric wires are led out of the casing. Then, covers are attached to the casing. The casing molded of a synthetic resin or the like is a member separate from the covers. The structure of the casing tends to become complicated in view of waterproofing measures, connection of terminals and electric wires, etc.

In addition, covers are indispensable because electronic parts have to be housed afterward. For this reason, the conventional junction box is structured by taking waterproofing measures into consideration as stated above. In consequence, the conventional junction box suffers from the problems that the casing itself becomes large in size, and the weight and cost also increase. In the case of the engine room of an automobile, vibration and noise prevention measures must be taken into consideration in addition to waterproofing because running is involved. Automobiles now tend to be lighter in weight, and developments and efforts have been made to achieve lightweight structures for vehicle bodies and engines. In this regard, junction boxes are also not exceptions.

With the above-described technical background, the present invention was made to attain the following objects.

An object of the present invention is to provide electrical equipment for junction, which is conventionally known as a "junction box", wherein a board having electronic parts mounted thereon is integrally sealed and covered with covers, thereby achieving reductions in size and weight of the electrical equipment, and also provide a method of manufacturing the electrical equipment for junction.

Another object of the present invention is to provide electrical equipment for junction in which electronic parts, a board and so forth are hermetically sealed to implement waterproofing and vibration isolation measures, and also provide a method of manufacturing the electrical equipment for junction.

Still another object of the present invention is to provide electrical equipment for junction that is simplified in structure to reduce costs, and also provide a method of manufacturing the electrical equipment for junction.

The electrical equipment for junction and the method of manufacturing the same according to the present invention have the following advantages. The electrical equipment for junction has electronic parts tightly joined in the state of being housed with covers made of an aluminum alloy or the like. Therefore, the electrical equipment can be reduced in size and weight. Further, the peripheral edge of the covers is completely hermetically sealed to seal the electronic parts and so forth. Therefore, entry of water is completely prevented, and the structure is effective and excellent in heat dissipation and vibration isolation properties. Further, because the electrical equipment for junction has a simplified structure, it is possible to employ a manufacturing method of high productivity, e.g. an injection molding process, and hence possible to realize a reduction in cost of the electrical equipment. Employing the electrical equipment contributes to reduction in cost as well as weight of products such as automobiles.

Patent Document 1: Japanese Patent Application Publication No. Hei 11-308733
Patent Document 2: Japanese Patent Application Publication No. Hei 10-4274

DISCLOSURE OF THE INVENTION

To attain the above-described objects, the present invention adopts the following means.

Electrical equipment for junction according to a first aspect of the present invention comprises: a board for mounting electronic parts and terminals; a face cover that covers the face of the board to seal the electronic parts, while allowing the terminals to project out of the face cover; a back cover that covers and seals the back of the board; and a sealing member molded where the respective peripheral edges of the face and back covers are superimposed on one another to hermetically seal the board in such a way that the terminals project out of the sealing member.

According to a second aspect of the present invention, the face cover and/or the back cover of the electrical equipment for junction according to the first aspect of the present invention is made of an aluminum alloy that is placed to hermetically seal the board and/or the electronic parts.

According to a third aspect of the present invention, the face cover and/or the back cover of the electrical equipment for junction according to the first aspect of the present invention is made of a synthetic resin that is placed to hermetically seal the board and/or the electronic parts.

According to a fourth aspect of the present invention, the sealing member of the electrical equipment for junction according to the first aspect of the present invention is made of a thermoplastic synthetic resin.

According to a fifth aspect of the present invention, the face cover of the electrical equipment for junction according to the first aspect of the present invention is configured to cover the electronic parts in close contact with the peripheries thereof.

According to a sixth aspect of the present invention, the face cover of the electrical equipment for junction according to the first aspect of the present invention is electrically insulated from the board and the electronic parts, and the back cover is electrically insulated from the board.

According to a seventh aspect of the present invention, the back cover or the face cover of the electrical equipment for junction according to any one of the first to sixth aspects of the present invention covers the board and/or the electronic parts in close contact with the peripheries thereof and has a heat-sink structure on the outside thereof.

According to an eighth aspect of the present invention, the face cover or the back cover of the electrical equipment for junction according to the second aspect of the present invention has an anodized aluminum surface.

According to a ninth aspect of the present invention, the face cover and the back cover of the electrical equipment for junction according to either of the second and third aspects of the present invention are partially fastened to each other at least one surface position other than the peripheral edges thereof.

According to a tenth aspect of the present invention, the sealing member of the electrical equipment for junction according to either of the second and fourth aspects of the present invention is a thermoplastic synthetic resin consisting essentially of a polybutylene terephthalate resin and/or a polyphenylene sulfide resin, which is injection-molded over the joint of the face and back covers to effect hermetic sealing after the joint of the face and back covers has been dipped in an aqueous solution of at least one selected from the group consisting of ammonia, hydrazine, and a water-soluble amine compound.

According to an eleventh aspect of the present invention, the sealing member of the electrical equipment for junction according to the fourth aspect of the present invention has sheath-shaped portions in which the terminals project out, the sheath-shaped portions allowing external terminals to be inserted thereinto and connected to the terminals.

According to a twelfth aspect of the present invention, the face cover or the back cover of the electrical equipment for junction according to the sixth aspect of the present invention is electrically insulated by applying electrical insulation coating thereto.

According to a thirteenth aspect of the present invention, the face cover or the back cover of the electrical equipment for junction according to the sixth aspect of the present invention is electrically insulated by attaching an electrical insulation seal thereto.

A method of manufacturing electrical equipment for junction according to a fourteenth aspect of the present invention comprises: a stacking step of stacking a board having electronic parts and terminals mounted thereon, together with a face cover and a back cover such that the board is sandwiched and covered between the face and back covers; an inserting step of inserting the assembly of the board covered with the face and back covers into a mold; and an injection molding step of injection-molding a thermoplastic synthetic resin over the peripheral edge of the assembly inserted to hermetically seal the assembly in such a way that a part of each terminal is contactable with an external terminal.

According to a fifteenth aspect of the present invention, the stacking step in the method of manufacturing electrical equipment for junction according to the fourteenth aspect of the present invention includes an electrically insulating step of placing an electrical insulating material between the board and the face cover or between the board and the back cover.

According to a sixteenth aspect of the present invention, the injection molding step in the method of manufacturing electrical equipment for junction according to the fourteenth aspect of the present invention includes a step of partially fastening together the face cover and the back cover at least one position near their centers.

According to a seventeenth aspect of the present invention, the method of manufacturing electrical equipment for junction according to the fourteenth aspect of the present invention is characterized in that the face cover and the back cover are partially fastened together at least one position thereof other than the peripheral edge after the injection molding step.

According to an eighteenth aspect of the present invention, the electrically insulating step in the method of manufacturing electrical equipment for junction according to the fifteenth aspect of the present invention is a step of attaching an electrical insulation seal.

The above-described means of the present invention will be explained below in detail. The present invention is characterized in that electronic parts and covers are integrated into a compact structure. In the following, however, the means of the present invention will be explained by way of an example in which an aluminum alloy is employed for the covers to simplify the junction box. It is a matter of course that the covers may be formed of a material other than an aluminum alloy, e.g. a plastic or other synthetic resin. Specific examples will be detailed in the section describing embodiments. First, a technique of tightly joining two aluminum alloy covers in superimposed form to effect hermetic sealing will be explained to help understanding of the present invention.

[Aluminum Alloy Used for Covers]

Aluminum alloys usable for the covers of the electrical equipment for junction are mainly those standardized as "1000 series" to "7000 series" by JIS (Japanese Industrial Standards) and those for die casting. The covers are produced by pressing a plate material. The pressed two covers, i.e. face and back covers, are tightly joined in superimposed form. A resin is injected over the joint of the two covers to bond them together. To effect resin bonding, a resin, i.e. a thermoplastic resin composition containing a polybutylene terephthalate resin (hereinafter referred to as "PBT") or a polyphenylene sulfide resin (hereinafter referred to as "PPS") as a component, is injected. The covers require that the surfaces thereof that are to be bonded should be free from a thick oxide or hydroxide layer, e.g. rust. If it is clear that rust is present on the surfaces of the covers as a result of these having been allowed to stand for a long period of time, the rust needs to be removed by polishing.

[Pretreatment of Aluminum Alloy]

The covers of the aluminum alloy are cleaned before being bonded, and then dipped in a basic aqueous solution, followed by rinsing with water. Next, the treated covers are dipped in an aqueous solution of at least one selected from the group consisting of ammonia, hydrazine, and a water-soluble amine compound. Next, the treated covers are inserted into an injection mold, and a thermoplastic resin composition is injected over the joint of the two covers to bond them together by injection molding.

[Thermoplastic Resin Composition]

The thermoplastic resin composition that is used in the present invention contains PBT or PPS as a main component, as has been stated above. It is preferable to add a filler thereto. Examples of preferable fillers are glass fiber, carbon fiber, aramid fiber, and other high-strength fibers similar to these. If a fibrous filler is added singly, however, strong directionality appears during injection molding, which is unfavorable depending upon the configuration. Therefore, it is preferable to use a thermoplastic resin composition containing calcium carbonate, magnesium carbonate, silica, talc, glass, clay, ground carbon fiber, ground aramid fiber, or other resin-filling inorganic fillers similar to them. The reason for using an aluminum alloy for the covers of the electrical equipment for junction according to the present invention is to obtain strong adhesion by the resin at the joint of the covers.

BEST MODE FOR CARRYING OUT THE INVENTION

Embodiments

Figure 1:
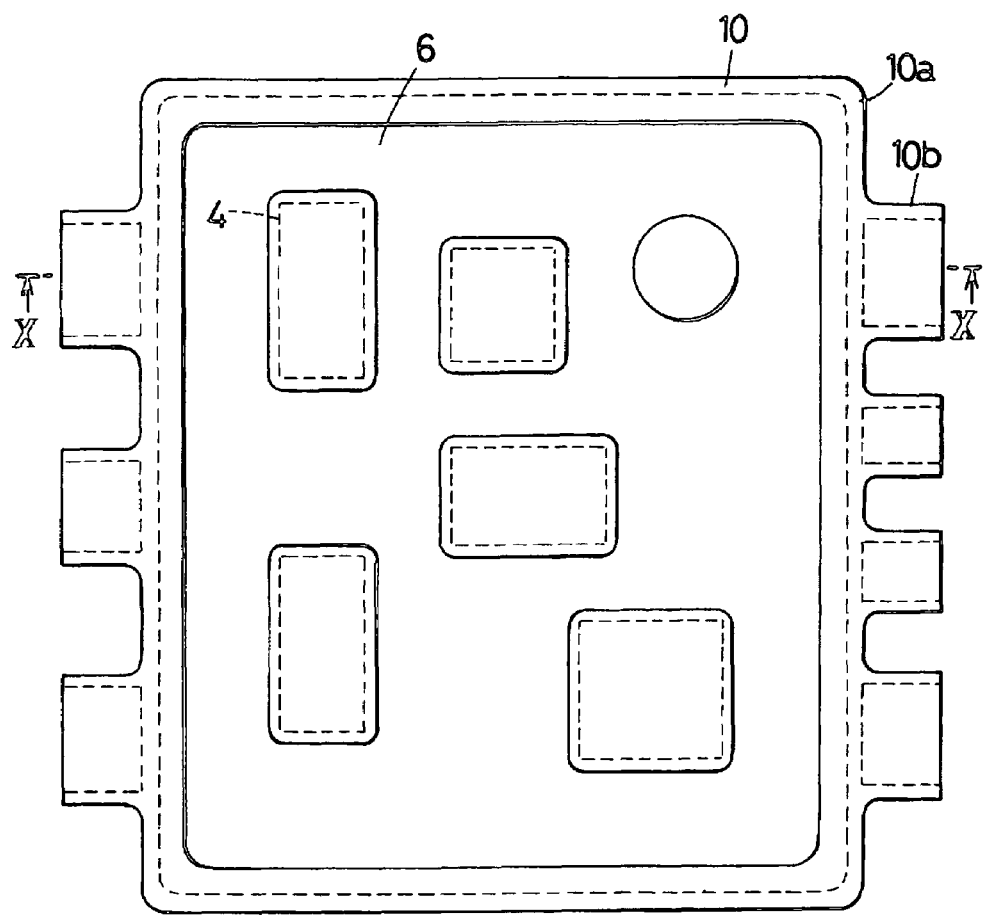
FIG. 1 is a plan view of electrical equipment for junction.
Figure 2:
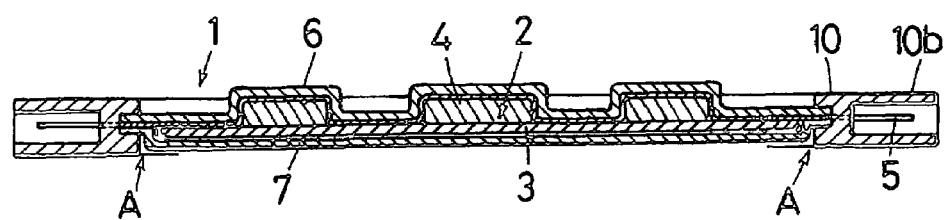
FIG. 2 is a sectional view of the electrical equipment for junction taken along the line X-X in FIG. 1.
Figure 3:
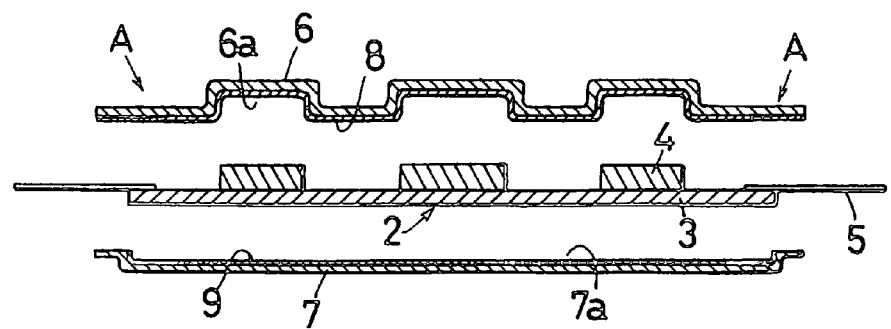
FIG. 3 is an exploded view of the electrical equipment for junction, showing the structure of each individual member.

Embodiments of the electrical equipment for junction (hereinafter referred to as "electrical equipment") relating to the present invention will be explained in detail with reference to the accompanying drawings. FIGS. 1 to 3 show an embodiment of electrical equipment 1 relating to the present invention. FIG. 1 is a plan view of the electrical equipment 1 of the present invention, and FIG. 2 is a sectional view taken along the line X-X in FIG. 1. FIG. 3 is an exploded view of the electrical equipment 1, showing the configuration of each individual member. The electrical equipment 1 according to this embodiment is a part of a controller installed in an engine room of an automobile or the like to control the running of the automobile, e.g. electrical equipment for relay, which is commonly known as "junction box".

As shown in the figures, the electrical equipment 1 houses an electrical component 2 therein. The electrical component 2 has electronic parts 4, e.g. IC chips, mounted on a board 3. The board 3 is provided with terminals 5 for electrical connection to external electrical components. The configuration of the board 3 and those of the electronic parts 4 mounted thereon differ according to the model of each automobile and so forth. However, because the number of automobiles produced is large, the number of electrical equipment 1 manufactured is correspondingly large. Accordingly, the automotive electrical equipment 1 is a product exhibiting a large mass-production effect. In the case of an automobile, the electrical equipment 1 is installed where it is exposed to an external environment such as wind and rain and where running vibration is involved. Therefore, the electrical component 2 must be protected.

Basically, the electrical equipment 1 according to this embodiment is covered with only two covers. The covers comprise a face cover 6 and a back cover 7. In this embodiment, covers made of an aluminum alloy are employed as the face and back covers 6 and 7. The face cover 6 covers and hermetically seals a side (the top as seen in FIG. 2) of the board 3 where the electronic parts 4 are mounted. The back cover 7 covers and hermetically seals the back (the bottom as seen in FIG. 2) of the board 3, opposite the side thereof where the electronic parts 4 are mounted. If the side of the board 3 where the electronic parts 4 are mounted is defined as "the top", the face cover 6 may be referred to as "top cover", the back cover 7 as "bottom cover". The face cover 6 has, as shown in the figures, recesses 6a formed in conformity to the shapes of the electronic parts 4 so as to cover the top of the board 3 with a minimum gap between the face cover 6 and the portions of the board 3 where the electronic parts 4 are mounted. That is, the face cover 6 has an uneven configuration as a whole.

The face cover 6 is produced from an aluminum alloy plate material by pressing. The surface of the face cover 6 facing the side of the board 3 where the electronic parts 4 are mounted is coated with an insulation coating material (e.g. insulation paint) 8 for electrical insulation. The back cover 7 is also produced by pressing in the same way as the face cover 6. The part of the back cover 7 where the board 3 is positioned and installed is, however, flat. That is, the back cover 7 is formed in a dish-like shape. The board 3 is installed in the flat part 7a inside the back cover 7 in such a way that the terminals 5 project out from the face cover 6 and the back cover 7. On the back cover 7, an insulation seal 9, which is an insulation sheet, is placed between the board 3 and the flat part 7a for electrical insulation, as in the case of the face cover 6. The insulation may be carried out such that an insulation seal is attached to the face cover 6, and insulation paint is applied to the back cover 7. The seal may be paper or the like. If electrical insulation is not necessarily required, however, neither an insulation seal nor an insulation coating material needs to be used. The board 3 is covered with the two covers as stated above, and the peripheral edges A of the covers are superimposed on one another and tightly joined together.

The assembly of the board 3 covered with the superimposed face and back covers 6 and 7 is inserted into a mold, and a resin is bonded to the peripheral edges A of the face and back covers 6 and 7 of an aluminum alloy by injection molding to form a resin mold 10. The resin mold 10 is a thermoplastic resin composition containing PBT or PPS as a main component, as has been stated above. The thermoplastic resin composition can be readily made fire resistant by mixing it with a fire retarding material, so that it can endure high temperatures. Further, the thermoplastic resin composition is preferably mixed with a fibrous filler and/or a powder filler to improve mechanical properties. The fibrous filler is preferably at least one selected from the group consisting of glass fiber, carbon fiber, and aramid fiber. The powder filler is preferably at least one selected from the group consisting of calcium carbonate, magnesium carbonate, silica, talc, glass, and clay.

Before the injection molding of the thermoplastic resin composition, the peripheral edges A of the face and back covers 6 and 7 are cleaned. Next, the covers are dipped in a basic aqueous solution, followed by rinsing with water. It should be noted, however, that the dipping in the basic aqueous solution is not necessarily an essential treatment. Thereafter, the covers subjected to these treatments are dipped in an aqueous solution of at least one selected from the group consisting of ammonia, hydrazine, and a water-soluble amine compound. Bonding of a resin to an aluminum alloy is publicly known, for example, from WO03/064150, which was filed by the present applicant. Therefore, a detailed description thereof is omitted herein. The resin mold 10 of the thermoplastic resin composition consists of a resin mold peripheral edge portion 10a and a plurality of connector portions 10b. Each connector portion 10b forms a receptacle in which a terminal 5 projects out nakedly, and the outside of the connector portion 10b is in the shape of a sheath. The connector portions 10b are configured to enable external terminals to be connected to the terminals 5 by insertion or the like. The thickness of the connector portions 10b, i.e. the dimension between the face and back sides thereof, is substantially the same as the thickness between the respective outer surfaces of the face and back covers 6 and 7. In addition, the resin mold 10 is provided with mounting portions (not shown) for mounting the electrical equipment 1 to an external device with screws or the like.

Either or both of the face and back covers 6 and 7 may be subjected to aluminum anodizing treatment. The aluminum alloy surface is susceptible to damage such as flaw. Therefore, the aluminum alloy is preferably subjected to aluminum anodizing treatment in which the aluminum alloy surface is electrolytically anodized. By the aluminum anodizing treatment, a high-hardness coating is formed on the aluminum alloy surface. Consequently, adsorptivity is improved, and it becomes possible to dye or color the aluminum alloy surface and hence possible to improve corrosion resistance, weather resistance, and contamination resistance.

Other Embodiments

Figure 4:
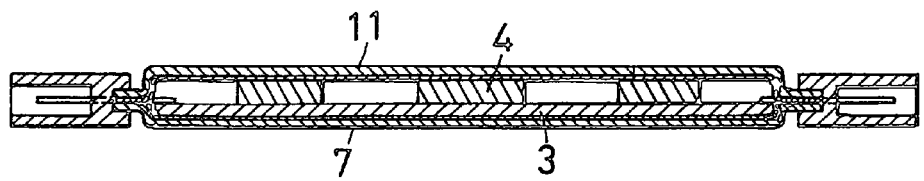
FIG. 4 is a sectional view of another embodiment, which is a structural example using a flat, dish-shaped face cover.

Next, other embodiments will be explained with reference to FIGS. 4 to 8. FIG. 4 shows an example in which the face cover is formed into a face cover 11 having a flat cover surface in the same way as the back cover 7, without being provided with recesses for the electronic parts 4. The height of the flat surface is set to the maximum height of the electronic parts 4. In this embodiment, a space occurs between the face cover 11 and the board 3 in contrast to the foregoing embodiment. The space is, however, hermetically sealed. With this embodiment, the cover is simplified in structure and formed into a general-purpose configuration that is not constrained by the layout of the electronic parts 4.

Figure 5:
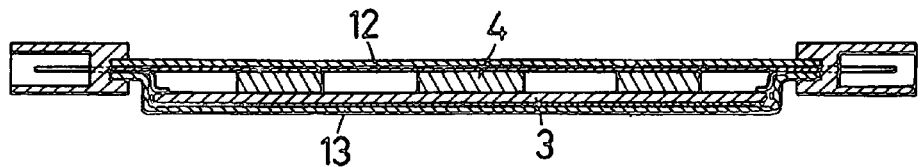
FIG. 5 is a sectional view of another embodiment, which is a structural example using a plate-shaped face cover.
Figure 6:
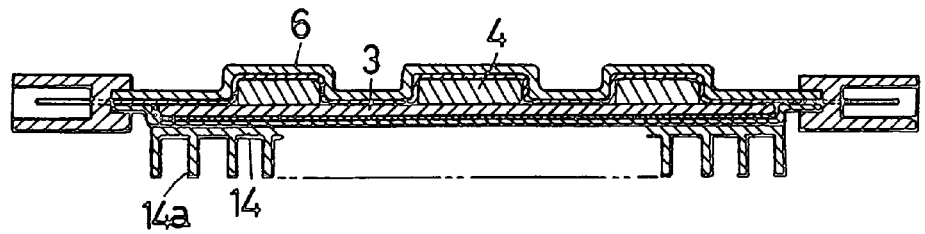
FIG. 6 is a sectional view of another embodiment, which is a structural example using a back cover provided with fins.

FIG. 5 shows another embodiment in which the structure shown in FIG. 4 is further simplified. That is, the face cover configuration is simplified as shown by a face cover 12 consisting only of a plate-shaped member. With this embodiment, pressing process for forming recesses is unnecessary because the face cover 12 has no recess. The electronic parts-housing part of the back cover 13 is, however, deeper than the recesses of the above-described back cover 7. In the embodiment shown in FIG. 5 also, a space occurs in the same way as in FIG. 4. The space is also hermetically sealed as in the case of FIG. 4. An embodiment shown in FIG. 6 has a back cover 14 provided with fins 14a for heat dissipation. The fins 14a enhance the effect of heat dissipation from the electrical equipment. In this case, if a heatpipe (not shown) is connected to the electrical equipment, a heatsink structure is constructed, and the effect of heat dissipation is further enhanced. The fins may be provided on the face cover 6.

Figure 7:
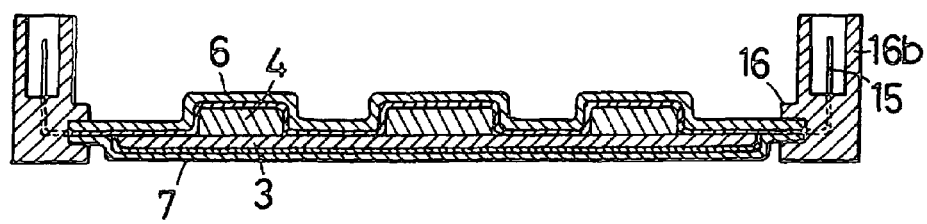
FIG. 7 is a sectional view of another embodiment, which is a structural example having connector portions changed in direction by 90 degrees.

An embodiment shown in FIG. 7 has terminals 15 changed in direction by 90 degrees. In consequence, connector portions 16b are changed in direction by 90 degrees. This structure is applied in a case where connection is made to the terminals 15 from a direction perpendicular to the surface of the board 3. In this case, the desired structure can be constructed by changing the molded configuration of the resin mold 16. The connector portions 16b are formed by injection molding to extend along the direction of the terminals 15 as shown in FIG. 7. That is, each connector portion 16b forms a receptacle in which a terminal 15 projects out nakedly, and the outside of the connector portion 16b is in the shape of a sheath in the same way as the above.

Figure 8:
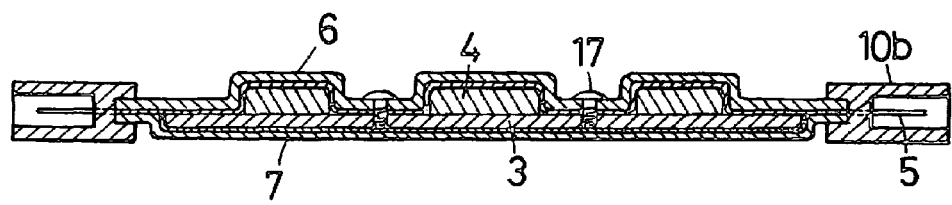
FIG. 8 is a sectional view showing a structural example in which face and back covers are bonded together at their centers.

FIG. 8 shows an embodiment in which the face cover 6 and the back cover 7 are partially joined together at their centers. In this case, the face cover 6 or the back cover 7 is provided with a hole, and the board 3 is also provided with a hole. A resin is injected into the holes from the cover-side hole to form a resin mold 17 in the holes, thereby bonding together the two covers. A screw may be used to join together the two covers. If the injection bonding is carried out at a plurality of necessary positions, the electrical equipment 1 becomes so firm that it can also endure vibrations. In this embodiment, lifting of the cover can also be effectively prevented.

Figure 9:
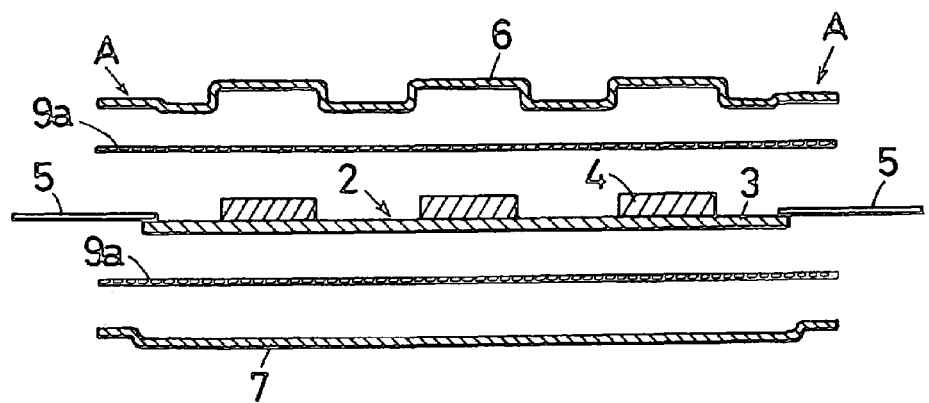
FIG. 9 is a sectional view of another embodiment using electrical insulation seals, which shows components of the electrical equipment for junction separately from each other.
Figure 10:
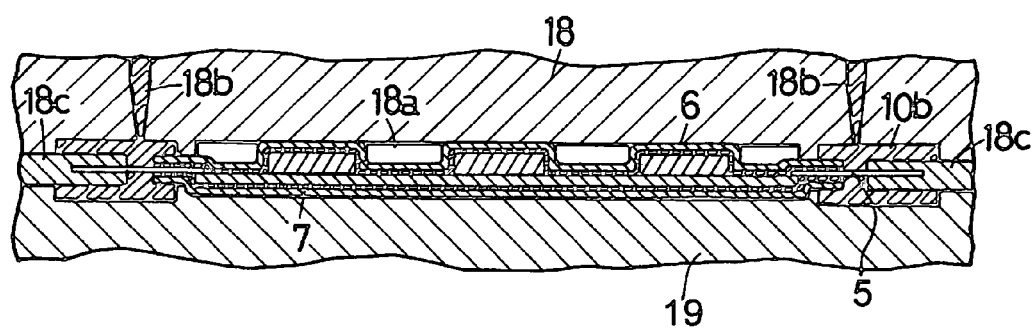
FIG. 10 is a structural view of a mold for molding the electrical equipment for junction.

FIGS. 9 to 13 show further embodiments particularly concerned with the manufacturing method. FIG. 9 is equivalent to FIG. 3 but an exploded view showing an arrangement in which an electrical insulation seal 9a is stuck between the board and the face cover, and another electrical insulation seal 9a between the board and the back cover, and in this state, the two covers are tightly joined together in superimposed form. When superimposed, the electrical insulation seal 9a is deformed along the configurations of the electronic parts 4. FIG. 10 shows the way in which the assembly of the superimposed covers and so forth arranged as shown in FIG. 9 is inserted into a mold, and the peripheral edges A are joined together by injection molding. The assembly may be inserted into either a stationary mold part 18 or a movable mold part 19. The portion of the mold corresponding to the cover central portion, which is not injection-molded, partly forms a space 18a.

Figure 11:
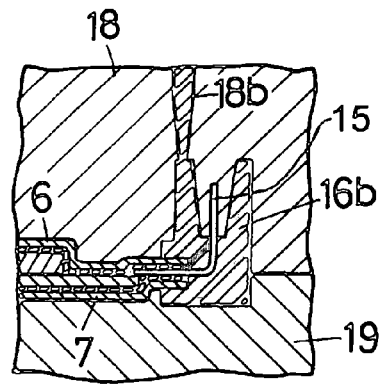
FIG. 11 is a fragmentary sectional view of another embodiment having connector portions changed in direction, which shows the structure of a mold for molding the electrical equipment for junction.

As shown in FIG. 10, the portion of the mold corresponding to the peripheral edge A of the assembly of the superimposed covers forms a cavity including connector portions 10b. A thermoplastic resin is injected into the cavity from gates 18b of the stationary mold part 18 to mold the peripheral edge A. The peripheral edge A hermetically seals the assembly over the entire circumference, with the connector portions 10b projecting from the peripheral edge A. After the thermoplastic resin injected from the gates 18b has solidified, cores 18c for the connector portions 10b are withdrawn. Thereafter, the stationary mold part 18 and the movable mold part 19 are opened by relative movement therebetween. Thus, the assembly is completed as electrical equipment 1.

Where on the connector portions 10b the cores 18c should be split is a matter of design. The electrical equipment 1 can be manufactured simply by injection molding the assembly prepared as stated above. FIG. 11 shows an embodiment in which connector portions are changed in direction by 90 degrees. Because the direction of the receptacles of the terminals 15 is coincident with the mold opening-closing direction, no core is needed. Accordingly, the mold configuration is simplified.

Figure 12:
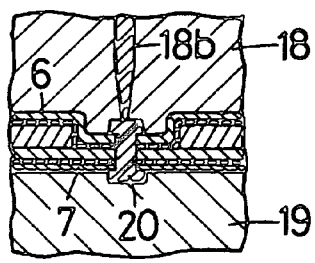
FIG. 12 is a fragmentary sectional view of another embodiment, showing a structural example in which face and back covers are bonded together at their centers by injection molding.

FIG. 12 shows an embodiment in which the two covers of the assembly are partially bonded together also at their centers by injection molding as in the case of the peripheral edge A. The bonding method is as stated above. Let us, however, explain it in detail. The face and back covers are provided with a hole extending therethrough, and the two covers are inserted into a mold. The mold is configured by taking into account the bonding portion. That is, the mold is provided with a gate 18b at the position of the bonding portion. A thermoplastic resin is injected into only the bonding portion from the gate 18b to form a bonding structure 20. When the thermoplastic resin entering the holes has solidified, it fastens the two covers together by clamping them.

Figure 13:
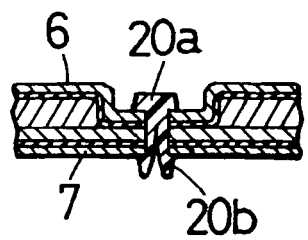
FIG. 13 is a fragmentary sectional view of another embodiment showing a structural example in which face and back covers are joined together at their centers by using a fastening member.
Figure 14:
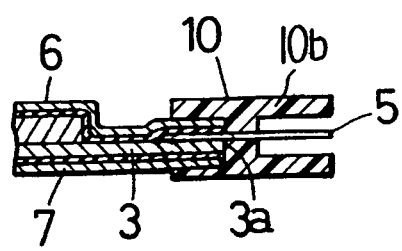
FIG. 14 is a sectional view of another embodiment, showing an end portion of the electrical equipment for junction.
Figure 15:
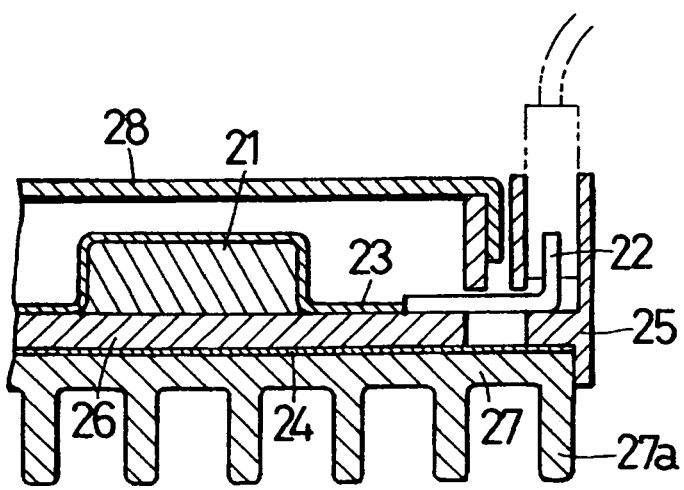
FIG. 15 is a fragmentary sectional view showing a structural example of a conventional junction box.

FIG. 13 shows another embodiment in which the centers of the two covers are joined together by a method other than injection molding. After the two covers have been superimposed over each other, a hole is made in the two covers to extend therethrough, and a fastening member 20a is inserted into the hole to fasten the two covers together. The fastening member 20a has a split end portion. When inserted into the hole, the fastening member 20a contracts like a spring. Immediately after being inserted, the fastening member 20a springs open, and hook portions 20b engage the cover surface, thereby fastening together the two covers. This fastening process can be performed as additional work according to need even after the completion of the electrical equipment 1. The fastening process using the fastening member 20a may be carried out either before the insertion into the mold or after the injection molding. In the foregoing embodiment, the face cover 6 and the back cover 7 are joined together in a stack. In an embodiment shown in FIG. 14, which is a sectional view of an end portion of electrical equipment 1, a board 3 and face and back covers 6 and 7 disposed on both sides of the board 3 are aligned with each other at the same end face 3a and fastened together with a resin mold 10.

In the maintenance of the electrical equipment arranged according to the foregoing embodiments of the present invention, even if a problem occurs in only a part of the electronic parts, the electrical equipment is not disassembled but replaced in its entirety with new one. On the assumption of this, the electrical equipment according to the embodiments of the present invention is completely hermetically sealed.

Although the electrical equipment according to the present invention has been detailed above, specific arrangements of the electrical equipment are not necessarily limited to the foregoing embodiments, but the electrical equipment can be constructed in various forms according to the model of each automobile and so forth. Although in FIGS. 6, 7 and 8 the covers are shown based on the configurations shown in FIG. 2, the covers may have configurations as shown in FIG. 4 or 5, for example. Further, in the foregoing description, covers of an aluminum alloy are subjected to special treatment, and a specific thermoplastic resin composition is injection-molded over the joint of the covers to form a resin mold. It is, however, a matter of course that the resin mold may be formed by a conventional injection molding process.

INDUSTRIAL APPLICABILITY

The electrical equipment for junction and the method of manufacturing the same according to the present invention are applicable not only to automotive electrical equipment but also to electrical coupling parts of household electrical products, industrial equipment, etc.

What is claimed is:

1. An electrical equipment for junction comprising:
   a board for mounting electronic parts and terminals;
   a face cover that covers a face of said board to seal said electronic parts, while allowing said terminals to project out of said face cover; and
   a back cover that covers and seals a back of said board; wherein
   a sealing member is made of a thermoplastic synthetic resin molded and by an injection molding in mold where respective peripheral edges of said face cover and said back cover are superimposed on one another to hermetically seal said board in such a way that said terminals project out of said sealing member; and
   said face cover and/or said back cover is made of an aluminum alloy that is placed to hermetically seal said board and/or said electronic parts.

2. The electrical equipment for junction according to claim 1, wherein said face cover is configured to cover said electronic parts in close contact with peripheries thereof.

3. The electrical equipment for junction according to claim 1, wherein said face cover is electrically insulated from said board and said electronic parts, and said back cover is electrically insulated from said board.

4. The electrical equipment for junction according to any one of claims 1, 2 or 3, wherein said back cover or said face cover covers said board and/or said electronic parts in close contact with peripheries thereof and has a heatsink structure on an outside thereof.

5. The electrical equipment for junction according to claim 1, wherein said face cover or said back cover has an anodized aluminum surface.

6. The electrical equipment for junction according to claim 1, wherein said face cover and said back cover are partially fastened to each other at at least one surface position other than said peripheral edges.

7. The electrical equipment for junction according to claim 1, wherein said sealing member is made of a thermoplastic synthetic resin consisting essentially of a polybutylene terephthalate resin and/or a polyphenylene sulfide resin, which is injection-molded over a joint of said face cover and said back cover to effect hermetic sealing after said joint has been dipped in an aqueous solution of at least one selected from the group consisting of ammonia, hydrazine, and a water-soluble amine compound.

8. The electrical equipment for junction according to claim 1, wherein said sealing member has sheath-shaped portions in which said terminals project out, said sheath-shaped portions allowing external terminals to be inserted thereinto and connected to said terminals.

9. The electrical equipment for junction according to claim 3, wherein said face cover or said back cover is electrically insulated by applying electrical insulation coating thereto.

10. The electrical equipment for junction according to claim 3, wherein said face cover or said back cover is electrically insulated by attaching an electrical insulation seal thereto.

11. A method of manufacturing electrical equipment for junction of claim 1, comprising:
  a stacking step of stacking a board having electronic parts and terminals mounted thereon, together with a face cover and a back cover such that said board is sandwiched and covered between said face cover and said back cover;
  an inserting step of inserting an assembly of said board covered with said face cover and said back cover into said mold; and
  an injection molding step of injection-molding said thermoplastic synthetic resin over a peripheral edge of said assembly inserted to hermetically seal said assembly in such a way that a part of each of said terminals is contactable with an external terminal.

12. The method of manufacturing electrical equipment for junction according to claim 11, wherein said stacking step includes an electrically insulating step of placing an electrical insulating material between said board and said face cover or between said board and said back cover.

13. The method of manufacturing electrical equipment for junction according to claim 11, wherein said injection molding step includes a step of partially fastening together said face cover and said back cover at at least one position near their centers.

14. The method of manufacturing electrical equipment for junction according to claim 11, further comprising:
  a fastening step of partially fastening together said face cover and said back cover at at least one position thereof other than said peripheral edge after said injection molding step.

15. The method of manufacturing electrical equipment for junction according to claim 12, wherein said electrically insulating step is a step of attaching an electrical insulation seal.

* * * * *